United States Patent [19]

Gurnee

[11] Patent Number: 4,871,921
[45] Date of Patent: Oct. 3, 1989

[54] DETECTOR ARRAY ASSEMBLY HAVING BONDING MEANS JOINING FIRST AND SECOND SURFACES EXCEPT WHERE DETECTORS ARE DISPOSED

[75] Inventor: Mark N. Gurnee, Framingham, Mass.
[73] Assignee: Honeywell Inc., Minneapolis, Minn.
[21] Appl. No.: 230,164
[22] Filed: Aug. 9, 1988
[51] Int. Cl.⁴ .............................................. H01J 40/14
[52] U.S. Cl. ...................................... 250/578; 357/30
[58] Field of Search ............... 358/213.22; 357/30 H, 357/30 Q, 68, 69; 250/211 J, 211 K, 578

[56] References Cited

U.S. PATENT DOCUMENTS 4,350,886  9/1982  Pommerrenig ..................... 250/578
4,449,044  5/1984  Rotolante et al. ................ 250/211 J
4,530,001  7/1985  Mori et al. ............................ 357/68
4,570,329  2/1986  Paine et al. ....................... 357/30 Q
4,729,003  3/1988  Schulte et al. .................... 357/30 Q
4,783,594 11/1988  Schulte et al. .................... 357/30 Q Primary Examiner—David C. Nelms
Assistant Examiner—William Oen
Attorney, Agent, or Firm—Kinney & Lange

[57] ABSTRACT

Method and apparatus for providing an improved detector array assembly in which the detectors are electrically connected from one substrate to another through adjoining "bump" connections but are prevented from distortion when an epoxy joining the two substrates hardens by locating the detectors so that the epoxy does not flow adjacent to them.

17 Claims, 1 Drawing Sheet

DETECTOR ARRAY ASSEMBLY HAVING BONDING MEANS JOINING FIRST AND SECOND SURFACES EXCEPT WHERE DETECTORS ARE DISPOSED

BACKGROUND OF THE INVENTION

1. Field of the Invention

This invention relates to a detector array assembly and, more particularly, to a detector array assembly in which "bump" interconnect members are used to provide electrical and/or mechanical connections between two substrates fastened together under pressure as, for example, by a cohesive material such as epoxy.

2. Description of the Prior Art

Prior art detector arrays have been assembled with "bump" interconnects joining two substrates. More particularly, raised areas of conductive and relatively soft and fusible material such as indium are located on each substrate. One of the substrates carries detector material such as mercury cadmium telluride for detecting radiation, particularly infrared radiation, and the other substrate carries electrical circuitry for interfacing the detectors with external signal utilization apparatus. The raised portions are then joined together to provide mechanical stability and electrical connections between the elements located on the two substrates. The two substrates may then be bonded together with, for example, an adhesive epoxy. In co-pending application Ser. No. 145,828, entitled "Method and Apparatus for Testing Equipment Having Compressible Contacts" filed in the name of Peter H. Zimmerman et al on Jan. 19, 1988, and assigned to the assignee of the present invention, a temporary "bump" interconnect arrangement is shown utilizing indium for producing a good electrical contact between the detector mounted on one base and a test station on the other base. Since the connection is temporary in this co-pending application, the permanent bonding of the two substrates is not shown; but when the two bases are to be permanently connected together, they are commonly joined by an epoxy backfill. A difficulty arises in utilizing epoxy, however, since upon hardening the epoxy tends to compress the two bases together and in doing so, while providing good electrical contact and mechanical strength, also causes the indium bumps to penetrate into the detector material itself which often causes unreliable operation.

SUMMARY OF THE INVENTION

The present invention overcomes the problem in the prior art by arranging the two substrates in such a manner that the epoxy backfill does not surround the detectors used for detecting radiation and thus, when the epoxy compresses on hardening, the detector material will not be distorted so that its operation will be more reliable.

DETAILED DESCRIPTION OF THE PREFERRED EMBODIMENTS

Figure 1:
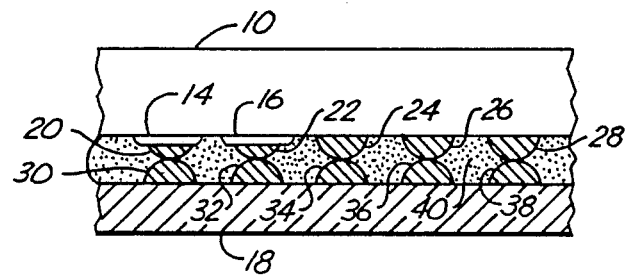
FIG. 1 shows a bump interconnect detector array assembly held together by epoxy material as is common in the prior art.

In FIG. 1, a first substrate 10, which may be composed of cadmium telluride or similar material, is shown having a pair of radiation sensitive detectors 14 and 16 which may be composed of mercury cadmium telluride formed in a layer on the underside thereof. In use, radiation from a remote source being observed passes through substrate 10 to impinge on detectors 14 and 16 which then produce an electrical output of a magnitude indicative of the intensity of the radiation received. Detectors 14 and 16 have been shown to be separate detectors in FIG. 1, but may be a continuous detector strip as is shown in the above-referred to co-pending application.

Also shown in FIG. 1 is a lower substrate 18 which may be composed of aluminum oxide, silicon, or similar material and is used to provide an electrical interface to receive the signals from detectors 14 and 16 and process them and/or send them to remotely located equipment. A plurality of "bump" interconnects 20, 22, 24, 26 and 28 are shown mounted on the underside surface of substrate 10 and a plurality of similar "bumps" 30, 32, 34, 36 and 38 are shown on the upper surface of lower substrate 18. Two pairs of bumps, i.e. 20,30 and 22,32, primarily provide electrical connections from the substrate 18 to the detectors 14 and 16, and three of the bump pairs 24, 34, 26,36, and 28,38 are shown primarily for mechanical strength in interconnecting substrates 10 and 18.

In the prior art, after the substrates 10 and 18 with the bump pairs thereon have been placed in contact with one another, an epoxy material 40 has been injected between the two substrates which are located approximately 0.01 mm apart, and so, by capillary action, the epoxy material flows in and around the space between the substrates 10 and 18 and around the bump pairs, including the detectors 14 and 16. As the epoxy material 40 hardens, it compresses and draws the substrates 10 and 18 closer together which provides good electrical contact between the bump pairs, but which also deforms the detectors 14 and 16 in an undesirable fashion. Thus, although good electrical and mechanical contact is made by the arrangement of FIG. 1, deleterious operation may result because of the undesirable deformation of detectors 14 and 16.

Figure 2:
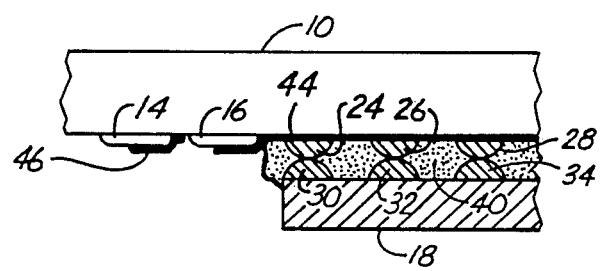
FIG. 2 shows a first embodiment of the present invention in which two detectors to be used for detecting radiation are positioned so as to overlay an area where there is no base substrate.

The present invention provides a solution to this problem as, for example, by the arrangement shown in FIG. 2. In FIG. 2, the substrate 10 is shown positioned above the substrate 18 but offset with respect thereto so that "bumps" 24, 26 and 28 of substrate 10 are in contact with "bumps" 30, 32 and 34 of substrate 18. Because of the offset, no material from substrate 18 lies beneath detectors 14 and 16 on substrate 10. Since there is no bump connecting detectors 14 and 16 to base 18, as was the case in FIG. 1, electrical attachments to detectors 14 and 16 are made by coatings 44 and 46 extending from other preselected "bumps" and making electrical contact with the detectors. With the arrangement shown in FIG. 2, when the epoxy 40 hardens substrates 10 and 18 will be drawn together as before, but since there is no epoxy surrounding detectors 14 and 16 there will be no compression thereof and the detectors will remain undistorted and better adapted for accurate use.

Figure 3:
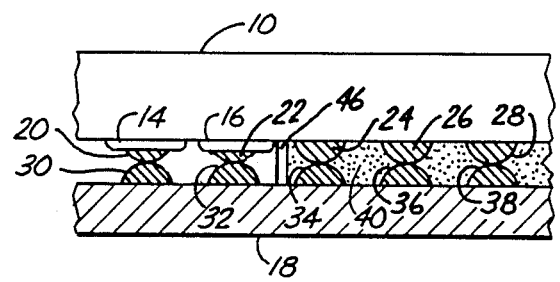
FIG. 3 shows an alternate embodiment of the present invention in which the detectors to be used for detecting radiation are positioned adjacent a dam that prevents epoxy from flowing therearound.

In FIG. 3, the substrate 10 is shown having detectors 14 and 16 and "bumps" 20, 22, 24, 26 and 28 thereon, while the lower substrate 18 is shown having "bumps" 30, 32, 34, 36 and 38 thereon and positioned directly below the substrate 10 in the same way that it was in FIG. 1. In FIG. 3, however, a dam member 46 is shown vertically extending between substrates 10 and 18 between bump pairs 22,32 and 24,34 so as to prevent the flow of epoxy 40 from entering into the region around detectors 14 and 16. Dam 46 may extend completely across the gap between substrates 10 and 18 or may extend partway across so long as it extends far enough to prevent the epoxy 40 from entering the region around detectors 14 and 16.

As was the case in FIG. 2, the epoxy in FIG. 3, when hardening, will draw members 10 and 18 closer together in the areas near detector pairs 24,34, 26,36 and 28,38, but not between detector pairs 20,30 and 22,32. Accordingly, the detectors 14 and 16 will, again, remain undistorted and more reliable and accurate. In the arrangement of FIG. 3, the electrical interconnect can be made as was it in FIG. 1, with the bump pairs 20,30 and 22,32 and, accordingly, the overlay conductive material 44 of FIG. 2 is not necessary.

Figure 4:
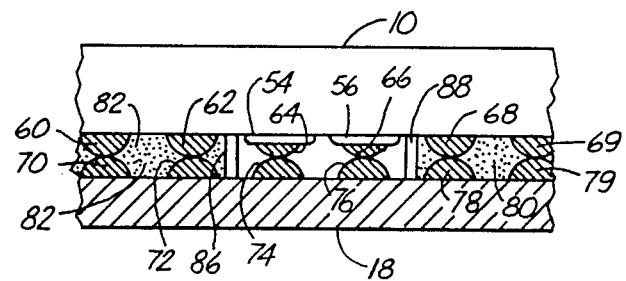
FIG. 4 shows an embodiment of the present invention in which a pair of dams is utilized to prevent epoxy from flowing around the detectors.

In FIG. 4, substrate 10 has two detectors 54 and 56 located in the central portion of the under side thereof, and has "bumps" 60, 62, 64, 66, 68 and 69 thereon. Substrate 18 has "bumps" 70, 72, 74, 76, 78 and 79 located on the upper surface thereof so as to form a plurality of bump pairs similar to the arrangement of FIG. 1. In FIG. 4, however, the epoxy material 80 and 82 is shown separated from the area around the detectors 54 and 56 by a pair of dams 86 and 88 so as to block the flow of epoxy therearound. Here again, the dams 86 and 88 may extend all the way across the gap between substrates 10 and 18, or partway so long as they prevent the flow of epoxy from around the detector surfaces 54 and 56. As was the case in FIGS. 2 and 3, as the epoxy 80 and 82 hardens an contracts, it will bring substrates 10 and 18 closer together in the areas around detector pairs 60,70, 62,72, 68,78 and 69,79, but not between detector "bumps" 64,74 and 66,76. Accordingly, as the material hardens and contracts there will be no undesirable distortion of the detectors 54 and 56 to provide for a better operation.

It is therefor seen that by preventing the epoxy from entering the area around the radiation detector material, the present invention provides for superior operation by preventing the distortion of the detectors.

Although the present invention has been described with reference to preferred embodiments, workers skilled in the art will recognize that changes may be made in form and detail without departing from the spirit and scope of the invention.

What is claimed is:

1. A detector array comprising:
   a first substrate having a first surface;
   a first plurality of electrically conductive bumps of material on the first surface at predetermined positions;
   at least one detector on the first surface at a first location;
   a second substrate having a second surface;
   a second plurality of bumps of electrically conductive material on the second surface at positions corresponding to the predetermined positions; and
   hardenable bonding means joining the first and second surfaces except proximate the first location, with a predetermined number of the first plurality of bumps contacting a corresponding number of the second plurality of bumps.

2. Apparatus according to claim 1 wherein there is no location on the second surface corresponding to the first location.

3. Apparatus according to claim 2 further including conductive means on the first surface contacting the detector and at least one of the bumps on the first surface that is in contact with a corresponding bump on the second surface.

4. Apparatus according to claim 1 further including dam means extending at least part way between the first and second surfaces and positioned to prevent the hardenable bonding material from entering the first location.

5. Apparatus according to claim 4 wherein the dam means surrounds the first location.

6. Apparatus according to claim 1 wherein the detector is an infrared radiation detector, the first substrate is transmission to infrared radiation and the second substrate is electrically conductive.

7. Apparatus according to claim 1 wherein the bonding means is epoxy which flows between the first and second surfaces and which contracts when it hardens to press the predetermined number of bumps of the first plurality against the corresponding number of bumps of the second plurality.

8. Apparatus according to claim 1 wherein the material for the detector is mercury cadmium telluride and the material of the bumps is indium.

9. Apparatus according to claim 8 wherein the material of the first substrate is cadmium telluride and the material of the second substrate is aluminum oxide.

10. Apparatus according to claim 9 wherein the material of the bonding means is epoxy.

11. The method of joining a first substrate having at least one detector positioned at a first location on a first surface thereof to a second surface on a second substrate comprising the steps of:
   A. positioning a first plurality of bumps on the first surface at predetermined locations;
   B. positioning a second plurality of bumps on the second surface at corresponding predetermined locations;
   C. placing the first and second substrates proximate one another with at least some of the bumps on the first surface in contact with corresponding bumps on the second surface;
   D. flowing a hardenable material between the first and second surfaces around the contacting bumps but not at the first location; and
   E. setting the hardenable material so as to bond the first and second surfaces together and press the contact bumps together except at the first location.

12. The method of claim 11 including the step of offsetting the first substrate so that the first location lies proximate no part of the second substrate.

13. The method of claim 11 including the step of forming a dam between the first and second surfaces to prevent flow of the hardenable material into the first location.

14. The method of claim 11 wherein the detector comprises mercury cadmium telluride and the first and second plurality of bumps comprise indium.

15. The method of claim 14 wherein the first substrate comprises cadmium telluride and the second substrate comprises aluminum oxide.

16. The method of claim 11 wherein the hardenable material is an epoxy.

17. The method of claim 15 wherein the hardenable material is an epoxy.

* * * * *

UNITED STATES PATENT AND TRADEMARK OFFICE
CERTIFICATE OF CORRECTION

PATENT NO. : 4,871,921

DATED : October 3, 1989

INVENTOR(S) : Mark N. Gurnee

It is certified that error appears in the above-identified patent and that said Letters Patent is hereby corrected as shown below:

Column 4, line 19, delete "transmission" and insert --transmissive--.

Signed and Sealed this

Twenty-eighth Day of August, 1990

Attest:

HARRY F. MANBECK, JR.

*Attesting Officer*     *Commissioner of Patents and Trademarks*